United States Patent
Ahn et al.

(10) Patent No.: US 8,274,067 B2
(45) Date of Patent: Sep. 25, 2012

(54) MEMORY DEVICES AND METHODS OF MANUFACTURING THE SAME

(75) Inventors: Seung-eon Ahn, Suwon-si (KR);
Myoung-jae Lee, Suwon-si (KR);
Suk-pil Kim, Yongin-si (KR);
Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 616 days.

(21) Appl. No.: 12/213,062

(22) Filed: Jun. 13, 2008

(65) Prior Publication Data

US 2008/0308783 A1    Dec. 18, 2008

(30) Foreign Application Priority Data

Jun. 14, 2007   (KR) .................. 10-2007-0058574
Apr. 3, 2008    (KR) .................. 10-2008-0031366

(51) Int. Cl.
*H01L 29/06* (2006.01)
(52) U.S. Cl. .................. 257/5; 257/2; 257/3; 257/4
(58) Field of Classification Search ........... 257/2–5; 438/900
See application file for complete search history.

(56) References Cited

U.S. PATENT DOCUMENTS

| | | | |
|---|---|---|---|
| 6,905,937 B2 | 6/2005 | Hsu et al. | |
| 7,002,197 B2 | 2/2006 | Perner et al. | |
| 7,423,300 B2 * | 9/2008 | Lung et al. | 257/207 |
| 2005/0135146 A1 | 6/2005 | Taussig et al. | |

FOREIGN PATENT DOCUMENTS

| | | |
|---|---|---|
| DE | 10 2004 037 152 A1 | 3/2006 |
| EP | 1 542 277 | 6/2005 |
| WO | WO 98/19350 | 5/1998 |
| WO | WO 2006/041430 A1 | 4/2006 |

OTHER PUBLICATIONS

Translation of DE 10 2004 037 152 A1.*
I.G. Baek et al., "Multi-layer Cross-point Binary Oxide Resistive Memory (OxRRAM) for Post-NAND Storage Application," Electron Devices Meeting, Dec. 5, 2005, pp. 750-753.
European Search Report dated Sep. 30, 2008 for corresponding European Application No. 08158140.7-1233.
Myoung-Jae Lee et al., "A Low-Temperature-Grown Oxide Diode as a New Switch Element for High-Density, Nonvolatile Memories," Advanced Materials, Jan. 8, 2007, vol. 19, No. 1, pp. 73-76.

* cited by examiner

*Primary Examiner* — Julio J Maldonado
*Assistant Examiner* — Sonya McCall Shepard
(74) *Attorney, Agent, or Firm* — Harness, Dickey & Pierce, PLC

(57) ABSTRACT

Memory devices and methods of manufacturing the same are provided. In a memory device, a memory-switch structure is formed between a first and second electrode. The memory-switch structure includes a memory resistor and a switch structure. The switch structure controls current supplied to the memory resistor. A memory region of the memory resistor and a switch region of the switch structure are different from each other.

28 Claims, 8 Drawing Sheets

MEMORY DEVICES AND METHODS OF MANUFACTURING THE SAME

PRIORITY STATEMENT

This non-provisional U.S. patent application claims the priority under 35 U.S.C. §119 to Korean Patent Application Nos. 10-2007-0058574, filed on Jun. 14, 2007, and 10-2008-0031366, filed on Apr. 3, 2008, in the Korean Intellectual Property Office, the entire contents of each of which are incorporated herein by reference.

BACKGROUND

Description of the Related Art

Conventional semiconductor memory devices include many memory cells connected in circuits. In a conventional dynamic random access memory (DRAM), for example, a unit memory cell may be composed of a switch and a capacitor. The DRAM may have a relatively high integration density and relatively fast operating speed. However, conventional DRAMs are volatile in that the devices lose all stored data when power is shut off. On the contrary, a conventional flash memory is nonvolatile in that stored data is retained even when power is shut off. A However, conventional flash memory devices have a lower integration density and a slower operating speed when compared to conventional DRAMs.

Examples of nonvolatile memory devices include a magnetic random access memory (MRAM), a ferroelectric random access memory (FRAM), a phase-change random access memory (PRAM), and a resistance random access memory (RRAM). A conventional RRAM uses variable resistance characteristics of a transition metal oxide whose resistance varies depending on certain conditions.

In a conventional resistive memory device, a diode is formed as a switch on a lower electrode. A memory resistor and an upper electrode are sequentially formed on the diode. Each of the lower electrode and the upper electrode may be formed of a conductive material used for a semiconductor device. The memory resistor may be formed of a transition metal oxide (TMO). Because switching current are used to change the resistance state of the memory resistor, obtaining a stable switching current is relatively important.

SUMMARY

Example embodiments relate to memory devices, for example, memory devices that may obtain a relatively stable switching current to drive the memory devices. At least some example embodiments may include different switch and memory regions. Example embodiments also provide methods for manufacturing memory devices.

At least one example embodiment provides a memory device. According to at least this example embodiment, the memory device may include a first electrode and a second electrode. A memory resistor and a switch structure may be formed between the first electrode and the second electrode. The switch structure may control current supplied to the memory resistor. A memory region of the memory resistor and a switch region of the switch structure may be different from each other.

According to at least some example embodiments, a switch region may be greater in size than the memory region. The memory device may further include an intermediate electrode formed between the memory resistor and the switch structure. An overlapping region between the switch structure, the first electrode, and the intermediate electrode may serve as the switch region. An overlapping region between the memory resistor, the intermediate electrode, and the second electrode may serve as the memory region.

According to at least some example embodiments, the intermediate electrode may have a contact plug integrally formed thereon such that the intermediate electrode may contact the memory resistor via the contact plug. The contact plug may have a width less than that of the intermediate electrode. The memory resistor may be formed in the contact hole formed through the insulating layer on a portion of the intermediate electrode. The switch structure may be a diode, a varistor, or a threshold switching device. The diode may have a bi-layer structure including, for example, an n-type oxide layer and a p-type oxide layer.

According to at least some example embodiments, the memory resistor may be formed of one selected from the group consisting of or including a nickel (Ni) oxide, titanium (Ti) oxide, hafnium (Hf) oxide, zirconium (Zr) oxide, zinc (Zn) oxide, tungsten (W) oxide, cobalt (Co) oxide, copper (Cu) oxide, iron (Fe) oxide, niobium (Nb) oxide, a combination thereof, or the like. The memory resistor may include a one-time programmable (OTP) material.

At least one other example embodiment provides a memory array including first electrodes formed in a first direction, and second electrodes formed in a second direction perpendicular to the first direction. First memory resistors and first switch structures may be formed between the first electrodes and the second electrodes. The first memory resistors may store information using multi-resistance characteristics. The first switch structures may control current supplied to the first memory resistors. Memory regions of the first memory resistors and switch regions of the first switch structures may be different from each other.

According to at least some example embodiments, the memory array may further include a plurality of third electrodes perpendicularly intersecting the second electrodes, and second memory resistors and second switch structures formed between the second electrodes and the third electrodes. The second memory resistors may store information using multi-resistance characteristics. The second switch structures may by bi-layer structures and may control current supplied to the second memory resistors. Memory regions of the second memory resistors and switch regions of the second switch structures may be different from each other.

At least one other example embodiment provides a memory device. According at least this example embodiment, the memory device may include a switch-memory structure arranged between a first and second electrode. The switch-memory structure may include a memory resistor and a switch structure arranged on between the first electrode and the memory resistor. The switch structure may be configured to control current supplied to the memory resistor. A memory region of the memory resistor and a switch region of the switch structure may be different from each other.

At least one other example embodiment provides a memory array. The memory array may include a plurality of first electrodes formed in a first direction and a plurality of second electrodes formed in a second direction. The second direction may be perpendicular to the first direction. A first switch-memory structure may be formed between one of the plurality of first electrodes and a corresponding one of the plurality of second electrodes. A plurality of second electrodes may correspond to each of the plurality of first electrodes. Each of the first switch-memory structures may include a first memory resistor configured to store information based on multi-resistance characteristics and a first switch structure coupled to the first memory resistor. The first switch structure may control current supplied to the first memory resistor. A first memory region of the memory resistor and a first switch region of the first switch structure may be different from each other.

At least one other example embodiment provides a method of manufacturing a memory array. According to at least one example embodiment, a first switch-memory structure may be formed between each of a plurality of first electrodes and corresponding one of a plurality of second electrodes. A plurality of second electrodes may correspond to each of the plurality of first electrodes. Each of the first switch-memory structures may include a first memory resistor configured to store information based on multi-resistance characteristics, and a first switch structure coupled to the first memory resistor. The first switch structure may be configured to control current supplied to the first memory resistor. A first memory region of the first memory resistor and a first switch region of the first switch structure may be different from each other.

At least one other example embodiment provides a method of manufacturing a memory device. According to at least this example embodiment, a switch-memory structure may be formed between a first and a second electrode. The switch-memory structure may include a memory resistor configured to store information based on multi-resistance characteristics, and a switch structure coupled to the memory resistor. The switch structure may be configured to control current supplied to the memory resistor. A memory region of the memory resistor and a switch region of the switch structure may be different from each other.

According to at least some example embodiments, the switch-memory structure may include an intermediate electrode formed between the memory resistor and the switch structure. The switch region may be a region of the switch structure overlapping region the first electrode and the intermediate electrode. The memory region may be a region of the memory resistor overlapping region the intermediate electrode and the second electrode. The first electrode and the intermediate electrode may vertically overlap the region of the switch structure. The intermediate electrode and the second electrode may vertically overlap the region of the memory resistor.

According to at least some example embodiments, the switch-memory structure may include an intermediate electrode formed on the switch structure, and an insulating layer formed on the intermediate electrode. The insulating layer may have a contact hole formed there through. The memory resistor may be formed in the contact hole. The switch structure may be a diode, a varistor, or a threshold switching device. The switch structure may be a multi-layer structure including at least two oxide layers.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
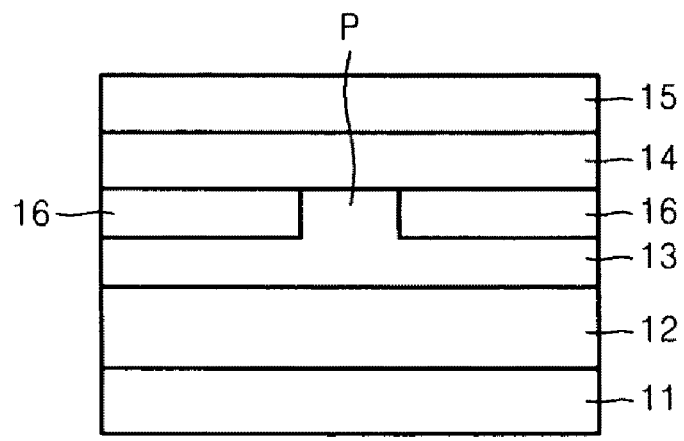
FIG. 1 is a cross-sectional view of a memory device according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a cross-sectional view of a memory device according to an example embodiment.

Referring to FIG. 1, a switch structure 12 and an intermediate electrode 13 may be sequentially formed on a first electrode 11. A memory resistor 14 may be formed on the intermediate electrode 13. The memory resistor 14 may be configured to store information using resistance characteristics. The intermediate electrode 13 and the memory resistor 14 may be connected to each other by a contact plug P. The contact plug P may be formed integrally with the intermediate electrode 13. In one example embodiment, the intermediate electrode 13 may be formed to have a protruding upper portion serving as the contact plug P.

Still referring to FIG. 1, an insulating layer 16 may be interposed between the intermediate electrode 13 and the memory resistor 14 at each side surface of the contact plug P. A second electrode 15 may be formed on the memory resistor 14. The switch structure 12, the intermediate electrode 13, the insulating layer 16 and the memory resistor 14 may be referred to as a switch-memory structure.

A memory region M of the memory resistor 14 and a switch region S of the switch structure 12 may be different from each other. For example, the switch region S may be an area of the switch structure 12 overlapping the first electrode 11 and the intermediate electrode 13. The memory region M may be an area of the memory resistor 14 overlapping the contact plug P of the intermediate electrode 13 and the second electrode 15. The area of the switch region S may be greater than the area of the memory region M. Materials of the layers will be explained in more detail below.

Figure 2A:
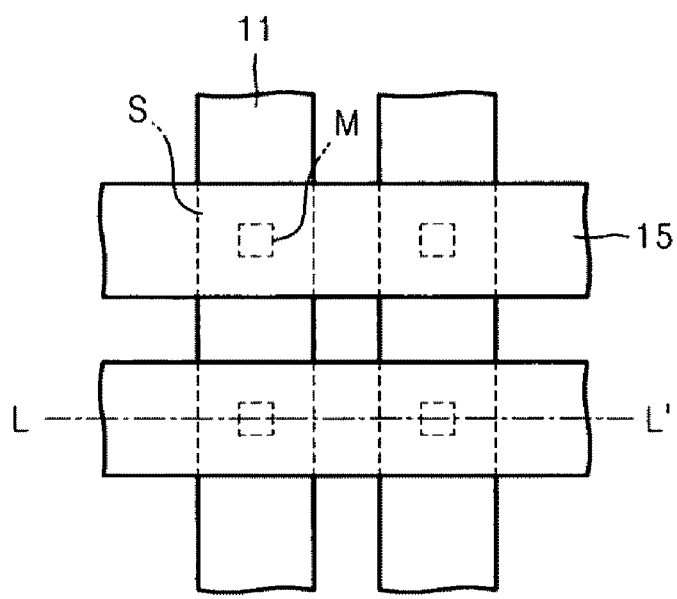
FIG. 2A is a plan view illustrating an example embodiment of an array structure of the memory device of FIG. 1.
Figure 2B:
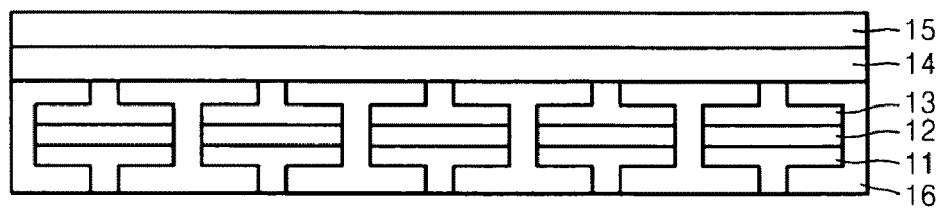
FIG. 2B is a cross-sectional view taken along line L-L' of FIG. 2A.

FIG. 2A is a plan view illustrating an example embodiment of an array structure of the memory device of FIG. 1. FIG. 2B is a cross-sectional view taken along line L-L' of FIG. 2A.

Referring to FIGS. 2A and 2B, a plurality of first electrodes 11 may be formed in a first direction and in parallel with one another. A plurality of second electrodes 15 may be formed in a second direction and in parallel with one another. The first direction may be perpendicular to the second direction. The plurality of first electrodes 11 and the plurality of second electrodes 15 may be formed to intersect (e.g., perpendicularly intersect) one another. The plurality of first electrodes 11 may be insulated from one another. The plurality of second electrodes 15 may also be insulated from one another. A switch structure 12, an intermediate electrode 13, and a memory resistor 14 that stores information using multi-resistance characteristics may be formed between each of the plurality of first electrodes 11 and a corresponding one of the plurality of second electrodes 15.

In FIGS. 2A and 2B, as discussed above with regard to FIG. 1, a region of the switch structure 12 overlapping the first electrode 11 and the intermediate electrode 13 may serve as a switch region S. Also in FIGS. 2A and 2B, a region of the memory resistor 14 overlapping the intermediate electrode 13 and the second electrodes 15 may serve as memory region M.

Figure 2C:
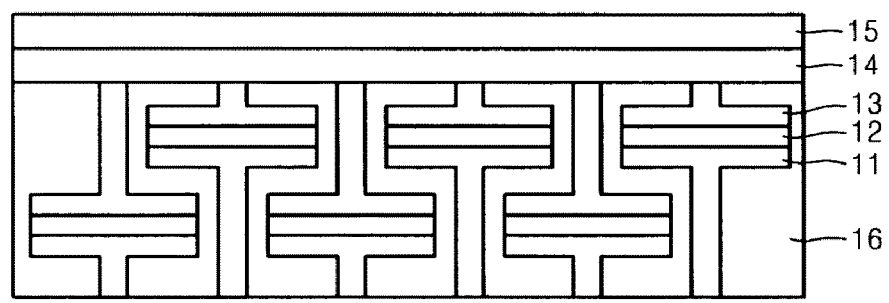
FIG. 2C is a cross-sectional view illustrating another example embodiment of an array structure of the memory array of FIG. 1.

FIG. 2C is a cross-sectional view illustrating another example embodiment of an array structure of the memory array of FIG. 1. As shown in FIG. 2C the first electrodes 11 may be formed to have a T-shaped cross-section, whereas the second intermediate electrodes 13 may be formed to have an upside-down T-shaped cross-section. According to at least this example embodiment, the intermediate electrodes 13 of adjacent memory devices may have upper portions extending different vertical lengths. Similarly, the first electrodes 11 of adjacent memory devices may have lower portions extending different lengths. Adjacent memory devices in the memory array may have overlapping (e.g., vertically overlapping) side surfaces. In at least one example embodiment, the array structure of FIG. 2C may have a higher degree integration than that of the array structure of FIG. 2B. When compared with conventional resistive memory devices, the memory device of FIG. 1 may obtain a higher switching current by using a lower operating voltage by increasing the area of the switch region S, thereby reducing power consumption.

A method of manufacturing a memory device according to an example embodiment will now be explained. At least this example embodiment may be used to manufacture at least the memory device shown in FIG. 1, and for the sake of clarity will be described with respect to the memory device shown in FIG. 1.

According to at least this example embodiment, the first electrode 11 may be formed. The switch structure 12 may be formed on the first electrode 11. The switch structure 12 may have a multi-layer (e.g., a bi-layer) structure including, for example, an n-type oxide layer and a p-type oxide layer. A conductive material may be coated on the switch structure 12 to form the intermediate electrode 13 having a contact plug P. An insulating material may be coated on the intermediate electrode 13 at side of the contact plug P to form the insulating layer 16. The intermediate electrode 13 and the contact plug P may be integrally formed with each other. In another example, the insulating layer 16 may be formed on the intermediate layer 13, and a hole may be formed in a portion of the insulating layer 16, thereby exposing a portion of the intermediate electrode 13. A conductive material may be filled in the hole to form the contact plug P. A variable resistance material, such as a transition metal oxide (TMO) or the like, may be coated on the contact plug P and the insulating layer 16 to form the memory resistor 14. A conductive material may be coated on the memory resistor 14 to form the second electrode 15.

Figure 3:
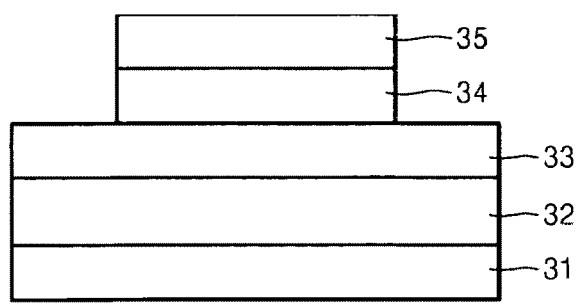
FIG. 3 is a cross-sectional view of a memory device according to another example embodiment.

FIG. 3 is a cross-sectional view of a memory device according to another example embodiment.

Referring to FIG. 3, a switch structure 32 and an intermediate electrode 33 may be sequentially formed on a first electrode 31. A memory resistor 34 and a second electrode 35 may be sequentially formed on the intermediate electrode 33. Each of the memory resistor 34 and the second electrode 35 may have a width less than that of the intermediate electrode 33 and/or the switch structure 32. The second electrode 35 and the memory resistor 34 may have equal or substantially equal widths. The switch structure 32, the intermediate electrode 33, and the memory resistor 14 may be referred to as a switch-memory structure.

According to at least this example embodiment, a structure of a switch region S of the switch structure 32 and a structure of a memory region M of the memory resistor 34 may be different from each other. For example, an area of the switch structure 32 overlapping the first electrode 31 and the intermediate electrode 33 may serve as the switch region S. An area of the memory resistor 34 overlapping the intermediate electrode 33 and the second electrode 35 may serve as the memory region M. The area of the switch region S may be greater than the area of the memory region M.

Figure 4A:
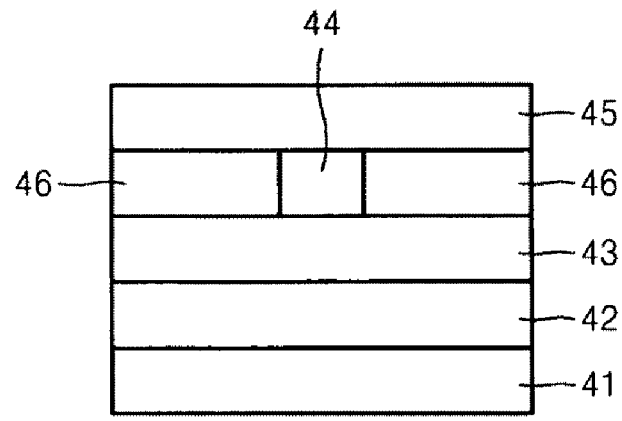
FIG. 4A is a cross-sectional view of a memory device according to another example embodiment.
Figure 4B:
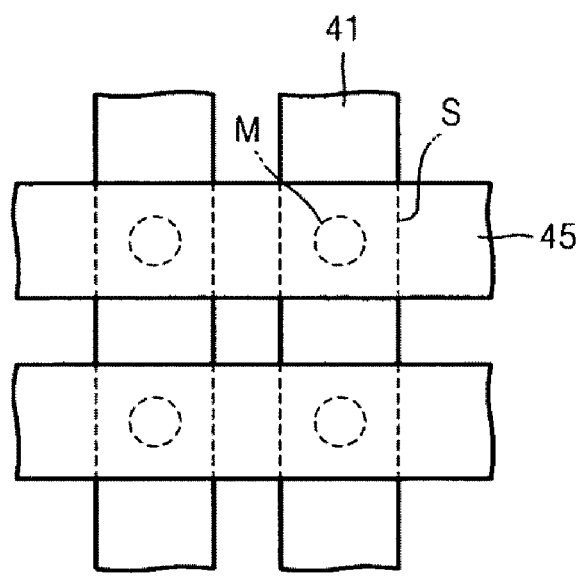
FIG. 4B is a plan view illustrating an example embodiment of an array structure of the memory device of FIG. 4A.

FIG. 4A is a cross-sectional view of a memory device according to another example embodiment. FIG. 4B is a plan view illustrating an example embodiment of an array structure of the memory device of FIG. 4A.

Referring to FIG. 4A, a switch structure 42 and an intermediate electrode 43 may be sequentially formed on a first electrode 41. An insulating layer 46 may be formed on the intermediate electrode 43. A contact hole may be formed in the insulating layer 46, and a memory resistor 44 may be formed in the contact hole. The memory resistor 44 may fill the contact hole. The memory resistor 44 may have a width less than that of the intermediate electrode 43. A second electrode 45 may be formed on the memory resistor 44 and the insulating layer 46. The switch structure 42, the intermediate electrode 43, the insulating layer 46 and the memory resistor 44 may be referred to as a switch-memory structure.

As shown in FIGS. 4A and 4B, the structure of a switch region S of the switch structure 42 and the structure of a memory region M of the memory resistor 44 may be different from one another. For example, an area of the switch structure 42 overlapping the first electrode 41 and the intermediate electrode 43 may serve as the switch region S. An area of the memory resistor 44 overlapping the intermediate electrode 43 and the second electrode 45 may serve as the memory region M. The area of the switch region S may be greater than the area the memory region M. Referring to FIG. 4B, as shown the memory region M may be smaller (e.g., much smaller) than the switch region S.

An example embodiment of a method of manufacturing a memory device according to another example embodiment will now be described. The method may be used to manufacture at least the memory device of FIG. 4A, and for the sake of clarity will be described with regard to the example embodiment shown in FIG. 4A.

According to at least this example embodiment, the first electrode 41 may be formed. The switch structure 42 may be formed on the first electrode 41. The switch structure 42 may be a diode having a multi-layer (e.g., bi-layer) structure including, for example, an n-type oxide layer and a p-type oxide layer. The intermediate electrode 43 may be formed on the switch structure 42, and an insulating layer 46 may be formed on the intermediate electrode 43. A hole may be formed through a portion of the insulating layer 46 to expose a portion of the intermediate electrode 43. A variable resistance material may be deposited in the contact hole to form the memory resistor 44. The variable resistance material may at least partially or completely fill the hole. For example, the upper surface of the variable resistance material may be planar with respect to the upper surface of the insulating layer 46. A conductive material may be coated on the memory resistor 44 and the insulating layer 46 to form the second electrode 45.

Figure 5A:
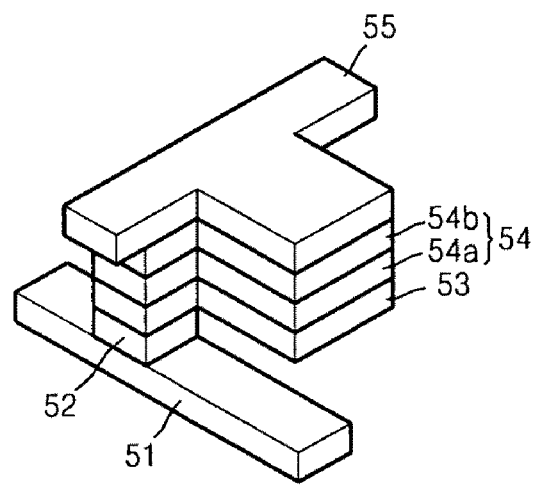
FIG. 5A is a perspective view of a memory device according to another example embodiment.

FIG. 5A is a perspective view of a memory device according to another example embodiment.

Referring to FIG. 5A, a memory resistor 52 that stores information using resistance characteristics may be formed on a first electrode 51. The memory resistor 52 may have a width equal or substantially equal to the first electrode 51. An intermediate electrode 53 may be formed on the memory resistor 52. A switch structure 54 may be formed on the intermediate electrode 53. The switch structure 54 may have a multi-layer structure including, for example, a first oxide layer 54a and a second oxide layer 54b. Alternatively, the positions of the first oxide layer 54a and the second oxide layer 54b may be reversed. The first oxide layer 54a and the second oxide layer 54b may be formed of, for example, an n-type oxide and a p-type oxide, respectively, or vice versa. The switch structure 54, the intermediate electrode 53, and the memory resistor 52 may be referred to as a switch-memory structure. The intermediate electrode 53 and the switch structure 54 may have the same or substantially the same shape. A second electrode 55 may be formed on the switch structure 54.

Figure 5B:
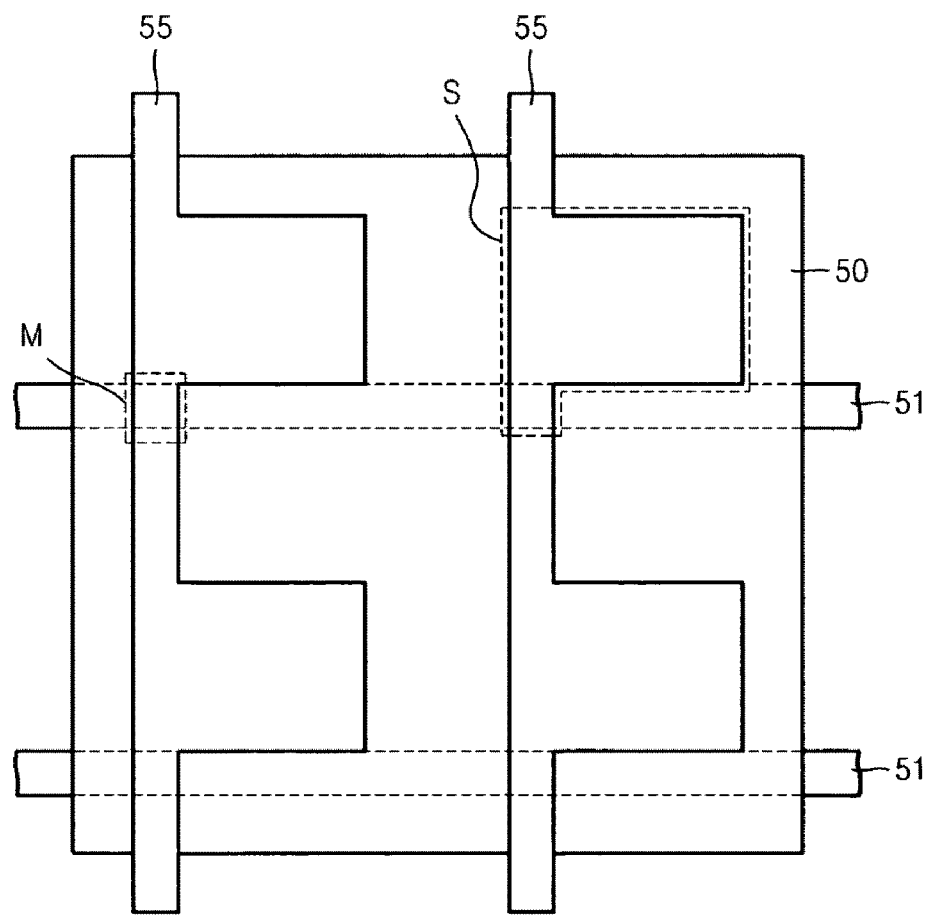
FIG. 5B is a plan view illustrating an example embodiment of an array structure of the memory device of FIG. 5A.

As shown in FIGS. 5A and 5B, a switch region S of the switch structure 54 may be different from a memory region of the memory resistor 52. For example, an area of the switch structure 54 overlapping the second electrode 55 and the intermediate electrode 53 may serve as the switch region S. An area of the memory resistor 52 overlapping the intermediate electrode 53 and the first electrode 51 may serve as the memory region M. The area of the switch region S may be greater than the area of the memory region M. Although not shown in FIG. 5A, but shown in FIG. 5B, an insulating layer 50 may be formed on side surfaces of the first electrode 51 and the memory resistor 52.

FIG. 5B is a plan view illustrating an example embodiment of an array structure of the memory device of FIG. 5A. Referring to FIG. 5B, the first electrodes 51 may be formed in a first direction, and the second electrodes 55 may be formed in a second direction. The first and second directions may be perpendicular or substantially perpendicular to one another.

Although not shown in FIG. 5B, but shown in FIG. 5A, the memory resistor 52, the intermediate electrode 53, and the switch structure 54 may be formed between the first electrode 51 and the second electrode 55. As noted above, the insulating layer 50 may be formed on side surfaces of the first electrode 51, the memory resistor 52, the intermediate electrode 53, and the switch structure 54.

Referring to FIGS. 5A and 5B, when the region of the memory resistor 52 overlapping the first electrode 51 and the intermediate electrode 53 serves as the memory region M and the region of the switch structure 54 overlapping the intermediate electrode 53 and the second electrode 55 serves as the switch region S, the area of the switch region S may be greater than that of the area of the memory region M. Thus, according to at least this example embodiment, the memory region M and the switch region S may be different from each other.

Figure 6:
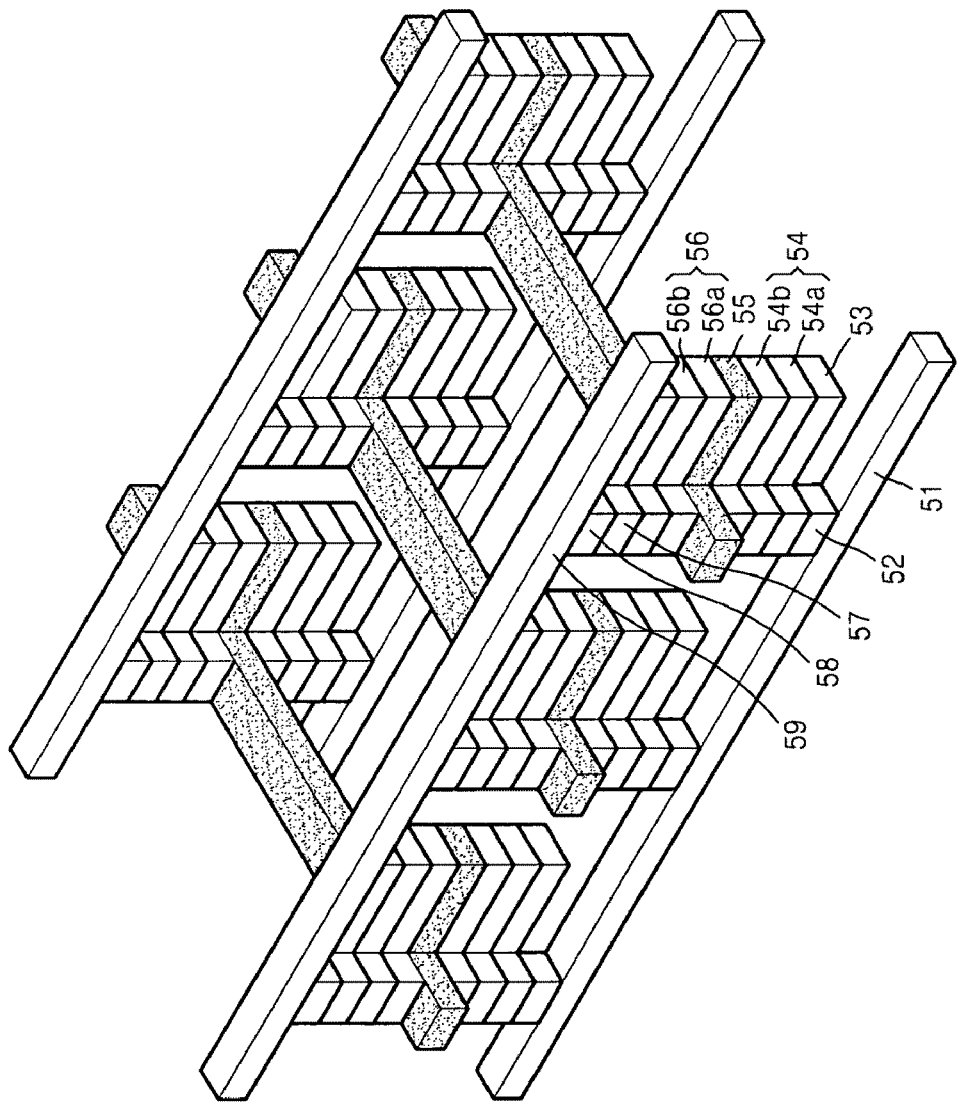
FIG. 6 is a perspective view illustrating an example embodiment of a multi-array structure of the memory device of FIG. 5A.

Memory devices according to at least some example embodiments may have a multi-array structure. FIG. 6 is a perspective view illustrating an example embodiment of a multi-array structure of the memory device of FIG. 5A.

Referring to FIG. 6, a plurality of first electrodes 51 may be formed in a first direction. A plurality of memory resistors 52 may be formed on the plurality of first electrodes 51. A switch structure 54 may be formed on each of the memory resistors 52. A second electrode 55 may be formed on each switch structure 54 in a second direction perpendicular to the first direction. The switch structures 54 may be, for example, diodes. Each switch structure 54 may include at least two oxide layers 54a and 54b.

A switch structure 56, an intermediate electrode 57 and a memory resistor 58 may be formed on each of the plurality of second electrodes 55. A plurality of third electrodes 59 may be formed on the plurality of switch structures 56. Each of the plurality of third electrodes 59 may correspond to one of the plurality of first electrodes 51. The switch structures 56 may be, for example, diodes. Each switch structure 56 may include at least two oxide layers 56a and 56b. The second electrodes 55 may be common electrodes for driving the switch structures 54 and 56. Although example embodiments of memory device are described with regard to a two-layer array structure in FIG. 6, memory devices according to example embodiments may be multi-layer array structures including three or more layers by forming memory resistors, intermediate electrodes, switch structures, and upper electrodes on the third electrodes 59, and so on.

The materials of the elements of example embodiments of memory devices shown, for example, in FIGS. 1 through 6 will now be explained.

The first electrodes 11, 31, 41, and 51, the second electrodes 15, 35, 45, and 55, and the third electrode 59 may be formed of electrode materials used for semiconductor devices, for example, Al, Hf, Zr, Zn, W, Co, Au, Ag, Pd, Pt, Ru, Ir, Ti, a combination thereof, or a conductive metal oxide. The terms "first electrode" and "second electrode" may be reversed.

The intermediate electrodes 13, 33, 43, 53, and 57 may electrically connect the memory resistors 14, 34, 44, 52, and 58 and the switch structures 12, 32, 42, 54, and 56, respectively. If the intermediate electrodes 13, 33, 43, 53, and 57 are omitted, the switch structures 12, 32, 42, 54, and 56 may act as resistors, which may cause problems during operation. For example, if the switch structures 12, 32, 42, 54, and 56 are diodes and the intermediate electrodes 13, 33, 43, 53, and 57 are omitted, the switch structures 12, 32, 42, 54, and 56 may be damaged when the memory resistors 14, 34, 44, 52, and 58 perform a set operation, thereby losing rectification characteristics. The intermediate electrodes 13, 33, 43, 53, and 57 may be formed of, for example, Al, Hf, Zr, Zn, W, Co, Au, Ag, Pd, Pt, Ru, Ir, Ti, a combination thereof, or a conductive metal oxide.

The switch structures 12, 32, 42, 54, and 56 may be non-ohmic devices such as diodes, varistors, threshold switching devices, etc. If the switch structures 12, 32, 42, and 54 are diodes, each of the switch structures 12, 32, 42, and 54 may have a multi-layer (e.g., a bi-layer) structure including, for example, an n-type semiconductor layer and a p-type semiconductor layer or including an n-type oxide layer and a p-type oxide layer. For example, each of the switch structures 12, 32, 42, and 54 may be formed by sequentially stacking a p-type oxide layer formed of, for example, CuO and an n-type oxide layer formed of, for example, InZnO. Alternatively, each of the switch structures 12, 32, 42, and 54 may be formed by sequentially stacking a p-type oxide layer formed of, for example, NiO and an n-type oxide layer formed of, for example, $TiO_2$. CuO may be a p-type semiconductor material because $O^{2-}$ failing to combine with Cu may serve as a donor due to naturally induced Cu-deficiency. InZnO may be an n-type semiconductor material because $Zn^{2+}$ existing outside a lattice or failing to combine with O may serve as an acceptor due to naturally induced Zn-interstitial and O-vacancy.

The switch structures 22, 32, 42, and 54 may be formed of, for example, a crystalline oxide or an amorphous oxide that is more easily formed at room temperature. A silicon diode may require a relatively high temperature process at about 800° C. and electrodes and memory resistors may deteriorate due to the relatively high temperature process. However, an oxide diode may be formed at a relatively low temperature of, for example, about 300° C. or 400° C.

The insulating layers 16, 46, and 50 may be formed of an insulating material such as a Si oxide, a Si nitride or the like.

Each of the memory resistors 14, 34, 44, 52, and 58 may be formed of a variable resistance material used for a resistive memory device. In this example, the variable resistance material may include two or more resistance states according to current supplied to the variable resistance material. The memory resistors 14, 34, 44, 52, and 58 may be formed of, for example, a TMO such as a nickel (Ni) oxide, titanium (Ti) oxide, hafnium (Hf) oxide, zirconium (Zr) oxide, zinc (Zn) oxide, tungsten (W) oxide, cobalt (Co) oxide, copper (Cu) oxide, iron (Fe) oxide, or niobium (Nb) oxide, a combination thereof, or the like. In this example, the memory devices of FIGS. 1 through 6 may be rewritable memory devices that are reversibly switchable from a relatively high resistance state to a relatively low resistance state or from a relatively low resistance state to a relatively high resistance state. Alternatively, the memory devices shown in FIGS. 1 through 6 may be memory devices including a one-time programmable (OTP) material. For example, each of the memory resistors 14, 34, 44, 52, and 58 may include an antifuse that is irreversibly switchable from a relatively high resistance state to a relatively low resistance state. When each of the memory resistors 14, 34, 44, 52, and 58 includes a relatively high resistant multi-crystalline silicon thin film antifuse, a programming operation may be irreversible and performed only once. The antifuse may be formed of polysilicon, a silicon oxide, a silicon nitride, or the like.

The memory devices of FIGS. 1 through 6 according to example embodiments may be manufactured using a semiconductor process such as chemical vapor deposition (CVD), physical vapor deposition (PVD), atomic layer deposition (ALD) or the like.

Figure 7:
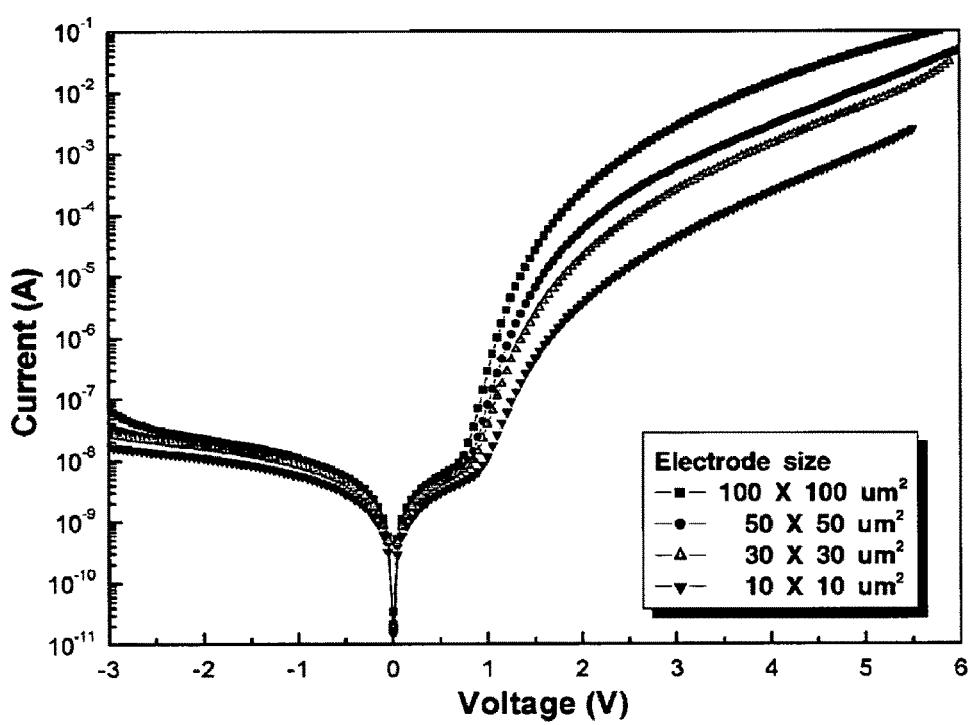
FIG. 7 is a graph illustrating the electrical characteristics of four memory device samples, each of which includes a first electrode and a second electrode formed of platinum (Pt), having diodes as switch structures with different areas each including a $TiO_2$ layer and a NiO layer.

FIG. 7 is a graph illustrating the electrical characteristics of four memory device samples, each including a first electrode and a second electrode which are formed of platinum (Pt). The memory devices include diodes as switch structures with different areas each including a $TiO_2$ layer (20 nm) and a NiO layer (20 nm). As shown in FIG. 7, as the area of a diode increases, current increases for the same or substantially the same voltage.

Figure 8:
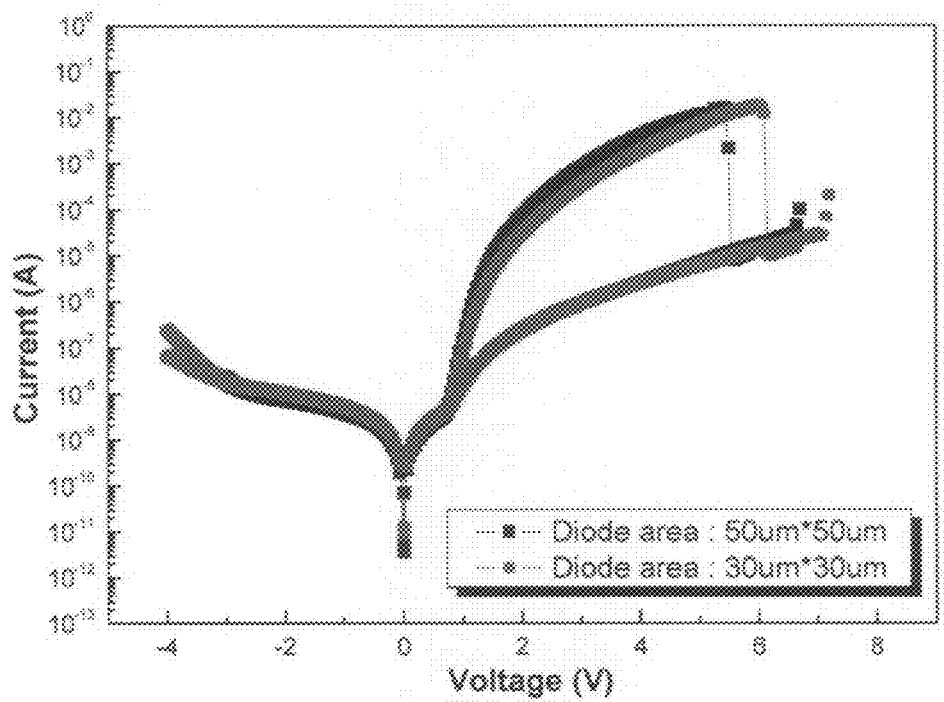
FIG. 8 is a graph illustrating a relationship between current and voltage of example embodiments of two memory devices having switch regions with different areas.

FIG. 8 is a graph illustrating a relationship between current and voltage of example embodiments of two memory devices having switch regions with different areas. In this example, a diode is formed on a first electrode. An intermediate electrode and a memory resistor formed of a Ni oxide are formed on the diode. A second electrode is formed on the intermediate electrode and the memory resistor. The first and second electrodes and the intermediate electrode are formed of Pt. The diode, which is a switch structure, includes $TiO_2$ and NiO. Two memory devices have switch regions with different areas, for example, an area of about 50 μm×50 μm and an area of about 30 μm×30 μm. To obtain the results shown in FIG. 8, current is applied to the two memory devices and measured.

As shown in FIG. 8, the amount of voltage required to obtain a reset current of about 10 mA in the 50 μm×50 μm switch region is less than the amount of voltage required to obtain a reset current of about 10 mA in the 30 μm×30 μm switch region. Accordingly, memory devices according to at least example embodiments may be driven at a lower voltage by reducing the area of the memory resistor or by increasing the area of the switch region.

Figure 9:
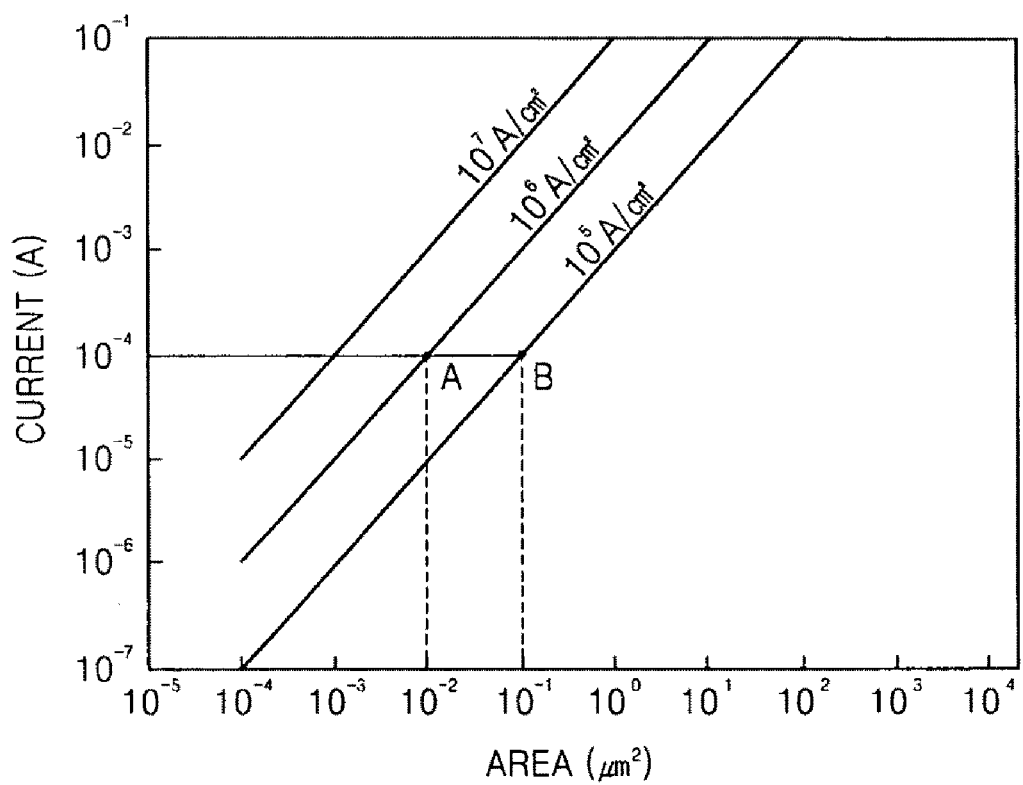
FIG. 9 is a graph illustrating a relationship between the area of a switch region and current supplied to a memory device according to an example embodiment.

FIG. 9 is a graph illustrating a relationship between the area of a switch region and current supplied to a memory device according to an example embodiment. In FIG. 9, the horizontal axis represents the area ($μm^2$) of a switch region, the vertical axis represents current A supplied to the switch region, and diagonal lines represent current density ($A/cm^2$) that refer to current flowing per unit area of the switch region.

Referring to FIG. 9, if a switch region S is square shaped having sides of about 100 nm, the area of the switch region is about $10^{-2}$ $μm^2$. When a reset current of a memory device is about $10^{-4}$ A, the memory device may be switched when current density is about $10^6$ $A/cm^2$. However, when the area of the switch region S increases to about $10^{-1}$ $μm^2$, the memory device may be switched even when current density is about $10^5$ A/cm² as shown in B. Accordingly, relatively low current density may be used by reducing the area of a memory region or increasing the area of the switch region. Hence, memory devices according to at least this example embodiment may obtain a relatively stable switching current while suppressing and/or preventing adverse affects an integration density by controlling a ratio of the area of the switch region to the area of the memory region.

While example embodiments have been particularly shown and described with reference to the example embodiments shown in the drawings, it will be understood by those of ordinary skill in the art that various changes in form and details may be made therein without departing from the spirit and scope of the present invention as defined by the following claims.

What is claimed is:

1. A memory device comprising:
    a first electrode;
    a second electrode; and
    a switch-memory structure arranged between the first and second electrodes, the switch-memory structure including,
        a memory resistor,
        a switch structure arranged between the first electrode and the memory resistor, the switch structure being configured to control current supplied to the memory resistor, the memory resistor having a memory region, and the switch structure having a switch region, the memory region and the switch region being different from each other in size, and
        an intermediate electrode formed between the memory resistor and the switch structure, the intermediate electrode having an integrally formed contact plug contacting the memory resistor.

2. The memory device of claim 1, wherein the switch region is greater in size than the memory region.

3. The memory device of claim 1, wherein
    the switch region is a region of the switch structure overlapping the first electrode and the intermediate electrode, and
    the memory region is a region of the memory resistor overlapping the intermediate electrode and the second electrode.

4. The memory device of claim 1, wherein the contact plug has a width less than a width of the intermediate electrode.

5. The memory device of claim 1, wherein the switch-memory structure further includes,
    an insulating layer formed on the intermediate electrode, the insulating layer having a contact hole formed there through; wherein
    the memory resistor is formed in the contact hole.

6. The memory device of claim 1, wherein the switch structure is a diode, a varistor, or a threshold switching device.

7. The memory device of claim 1, wherein the switch structure is a multi-layer structure including at least two oxide layers.

8. The memory device of claim 1, wherein the memory resistor is formed of one selected from the group consisting of a nickel (Ni) oxide, titanium (Ti) oxide, hafnium (Hf) oxide, zirconium (Zr) oxide, zinc (Zn) oxide, tungsten (W) oxide, cobalt (Co) oxide, copper (Cu) oxide, iron (Fe) oxide, niobium (Nb) oxide, and a combination thereof.

9. The memory device of claim 1, wherein the memory resistor is formed of a one-time programmable (OTP) material.

10. A method of manufacturing the memory device according to claim 1, the method comprising:
    forming the switch-memory structure between the first and the second electrode, the switch-memory structure including,
    the memory resistor configured to store information based on multi-resistance characteristics, and
    the switch structure coupled to the memory resistor, the switch structure being configured to control current supplied to the memory resistor.

11. The memory device of claim 3, wherein the first electrode and the intermediate electrode vertically overlap the region of the switch structure.

12. The memory device of claim 3, wherein the intermediate electrode and the second electrode vertically overlap the region of the memory resistor.

13. The method of claim 10, wherein the forming of the switch-memory structure includes,
    forming the switch structure on the first electrode,
    forming the intermediate electrode on the switch structure,
    forming an insulating layer on the intermediate electrode surrounding the contact plug, an upper surface of the insulating layer being planar with an upper surface of the contact plug, and
    forming the memory resistor on the upper surface of the contact plug and the insulating layer.

14. The method of claim 10, wherein the forming of the switch-memory structure includes,
    forming the switch structure on the first electrode,
    forming the intermediate electrode on the switch structure, and
    forming the memory resistor on the upper surface of the intermediate electrode, the memory resistor being formed to have a width less than a width of the switch structure.

15. The method of claim 10, wherein the forming of the switch-memory structure includes,
    forming the switch structure on the first electrode,
    forming the intermediate electrode on the switch structure,
    forming an insulating layer on the intermediate electrode,
    forming a contact hole through a portion of the insulating layer to expose a portion of the intermediate electrode, and
    forming the memory resistor in the contact hole.

16. A memory array comprising:
    a plurality of first electrodes formed in a first direction;
    a plurality of second electrodes formed in a second direction, the second direction being perpendicular to the first direction; and
    a plurality of first switch-memory structures arranged between each of the plurality of first electrodes and a corresponding one of the plurality of second electrodes, each of the first switch-memory structures including,
        a first memory resistor,
        a first switch structure coupled to the first memory resistor, the first switch structure controlling current supplied to the first memory resistor, the first memory resistor having a first memory region, and the first switch structure having a first switch region, the first memory region and the first switch region being different from each other in size, and
        an intermediate electrode formed between the first memory resistor and the first switch structure, the intermediate electrode having an integrally formed contact plug contacting the first memory resistor.

17. The memory array of claim 16, wherein the first switch region is greater in size than the first memory region.

18. The memory array of claim 16, wherein
the first switch region is a region of the first switch structure overlapping the first electrode and the intermediate electrode, and
the first memory region is a region of the first memory resistor overlapping the intermediate electrode and the second electrode.

19. The memory array of claim 16, wherein the contact plug has a width less than a width of the intermediate electrode.

20. The memory array of claim 16, wherein the first switch-memory structure further includes,
an insulating layer formed on the intermediate electrode, the insulating layer having a contact hole formed there through; wherein
the first memory resistor is formed in the contact hole.

21. The memory array of claim 16, wherein the first switch structure is a diode, varistor, or threshold switching device.

22. The memory array of claim 16, wherein the first switch structure is a multi-layer structure including at least two oxide layers.

23. The memory array of claim 16, wherein the first memory resistor is formed of one selected from the group consisting of Ni oxides, Ti oxides, Hf oxides, Zr oxides, Zn oxides, W oxides, Co oxides, Cu oxides, Fe oxides, Nb oxides, and a combination thereof.

24. The memory array of claim 12, further comprising:
a plurality of third electrodes arranged perpendicular to the plurality of second electrodes; and
a plurality of second switch-memory structures, each second switch-memory structure including,
a second memory resistor configured to store information based on multi-resistance characteristics, and
a second switch structure coupled to the second memory resistor, the second switch structure controlling current supplied to the second memory resistor, the second memory resistor having a second memory region, and the second switch structure having a second switch region, the second memory region and the second switch region being different from each other in size.

25. A method of manufacturing the memory array according to claim 16, the method comprising:
forming the first switch-memory structure between each of the plurality of first electrodes and corresponding second electrodes, each of the first switch- memory structures including,
the first memory resistor configured to store information based on multi-resistance characteristics, and
the first switch structure coupled to the first memory resistor, the first switch structure being configured to control current supplied to the first memory resistor.

26. The memory array of claim 18, wherein the first electrode and the intermediate electrode vertically overlap the region of the first switch structure.

27. The memory array of claim 18, wherein the intermediate electrode and the second electrode vertically overlap the region of the first memory resistor.

28. The method of claim 25, further comprising:
forming a second switch-memory structure between each of a plurality of third electrodes and a corresponding one of the plurality of second electrodes, each of the second switch-memory structures including,
a second memory resistor configured to store information based on multi-resistance characteristics, and
a second switch structure coupled to the second memory resistor, the second switch structure being configured to control current supplied to the second memory resistor, the second memory resistor having a second memory region and the second switch structure having a second switch region, the second memory region and the second switch region being different from each other in size.

* * * * *